(12) United States Patent
Shoji et al.

(10) Patent No.: US 8,463,086 B2
(45) Date of Patent: Jun. 11, 2013

(54) OPTICAL SEMICONDUCTOR DEVICE

(75) Inventors: Daisei Shoji, Kanagawa (JP); Takuya Fujii, Kanagawa (JP)

(73) Assignee: Sumitomo Electric Device Innovations, Inc., Yokohama, Kanagawa (JP)

( * ) Notice: Subject to any disclaimer, the term of this patent is extended or adjusted under 35 U.S.C. 154(b) by 505 days.

(21) Appl. No.: 12/749,629

(22) Filed: Mar. 30, 2010

(65) Prior Publication Data

US 2010/0247033 A1 Sep. 30, 2010

(30) Foreign Application Priority Data

Mar. 31, 2009 (JP) ................. 2009-087569

(51) Int. Cl.
*G02B 6/12* (2006.01)
*G02B 6/26* (2006.01)
*G02B 6/10* (2006.01)
*H01S 3/10* (2006.01)

(52) U.S. Cl.
USPC ............. 385/14; 385/43; 385/129; 385/130; 385/131; 385/132; 372/26

(58) Field of Classification Search
USPC .................. 385/14, 129–132, 43; 372/26, 36, 372/38, 43, 45, 46, 50
See application file for complete search history.

(56) References Cited

U.S. PATENT DOCUMENTS

| | | | |
|---|---|---|---|
| 6,104,738 A * | 8/2000 | Kitoh et al. | 372/46.01 |
| 6,678,299 B1 * | 1/2004 | Inaba et al. | 372/45.01 |
| 6,882,667 B2 | 4/2005 | Suzuki et al. | |
| 2003/0185257 A1 | 10/2003 | Suzuki et al. | |
| 2004/0119079 A1 | 6/2004 | Hayakawa et al. | |
| 2009/0034573 A1 * | 2/2009 | Takayama et al. | 372/49.01 |

FOREIGN PATENT DOCUMENTS

| | | |
|---|---|---|
| EP | 1065765 A2 | 1/2001 |
| JP | 08-288592 A | 11/1996 |
| JP | 2001-013472 A | 1/2001 |
| JP | 2003-298175 A | 10/2003 |
| JP | 2004-235600 A | 8/2004 |

OTHER PUBLICATIONS

Office Action mailed Mar. 12, 2013 in corresponding Japanese Patent Application 2009-087569. English Translation.

* cited by examiner

*Primary Examiner* — Brian Healy
*Assistant Examiner* — Hung Lam
(74) *Attorney, Agent, or Firm* — Westerman, Hattori, Daniels & Adrian, LLP

(57) ABSTRACT

An optical semiconductor device in which light having a wavelength of 1.25 µm or greater is waveguided, includes: a first waveguide of embedded type that includes a semiconductor and is lattice-matched with InP, the first waveguide having a region having a first constant width equal to or greater than 1.50 µm and a first region narrower than the region; and a second waveguide of embedded type that includes another semiconductor having a refractive index different from that of the first waveguide, the second waveguide having a region having a second constant width smaller than 1.50 µm and a second region wider than said region. The first waveguide and the second waveguide are joined at an intermediate waveguide portion. The intermediate waveguide portion includes the first region and the second region and a joining plane on which the first region and the second region are joined. The joining plane has a width equal to or smaller than 1.35 µm.

5 Claims, 5 Drawing Sheets

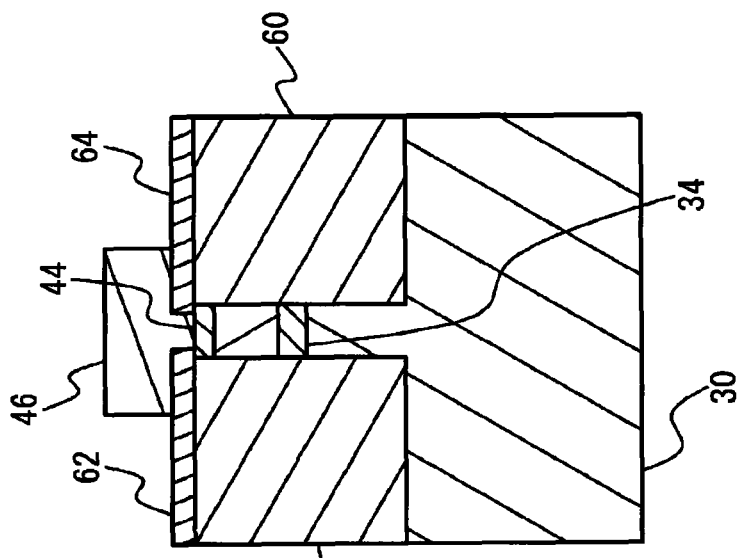
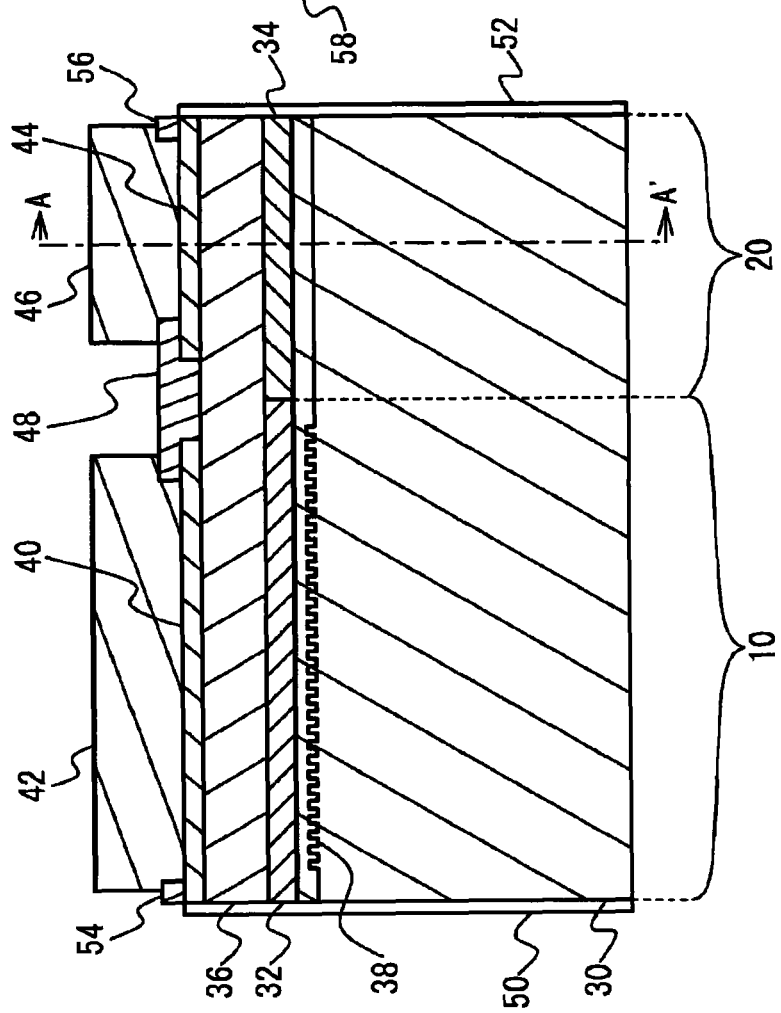
Fig. 1A
Fig. 1B

OPTICAL SEMICONDUCTOR DEVICE

CROSS-REFERENCE TO RELATED APPLICATION

This application is based upon and claims the benefit of priority of the prior Japanese Patent Application No. 2009-087569, filed on Mar. 31, 2009, the entire contents of which are incorporated herein by reference.

BACKGROUND (i) Technical Field

The present invention relates to an optical semiconductor device having two waveguides having different widths.

(ii) Related Art

There is known a modulator-integrated type semiconductor laser as an optical semiconductor device having two waveguides (see, for example, Japanese Patent Application Publication No. 2003-298175). The proposed modulator-integrated type semiconductor laser has a single semiconductor substrate on which a semiconductor laser and an optical modulator are mounted.

SUMMARY

An object of the present invention is to provide an optical semiconductor device having improved performance.

According to an aspect of the present invention, there is provided an optical semiconductor device in which light having a wavelength of 1.25 μm or greater is waveguided, including: a first waveguide of embedded type that includes a semiconductor and is lattice-matched with InP, the first waveguide having a region having a first constant width equal to or greater than 1.50 μm and a first region narrower than the region; and a second waveguide of embedded type that includes another semiconductor having a refractive index different from that of the first waveguide, the second waveguide having a region having a second constant width smaller than 1.50 μm and a second region wider than said region, the first waveguide and the second waveguide being joined at an intermediate waveguide portion, the intermediate waveguide portion including the first region and the second region and a joining plane on which the first region and the second region are joined, and the joining plane having a width equal to or smaller than 1.35 μm.

BRIEF DESCRIPTION OF THE DRAWINGS

FIGS. 1A and 1B illustrate structures of semiconductor lasers in accordance with a comparative example and an embodiment, respectively;

DETAILED DESCRIPTION

Figure 2A:
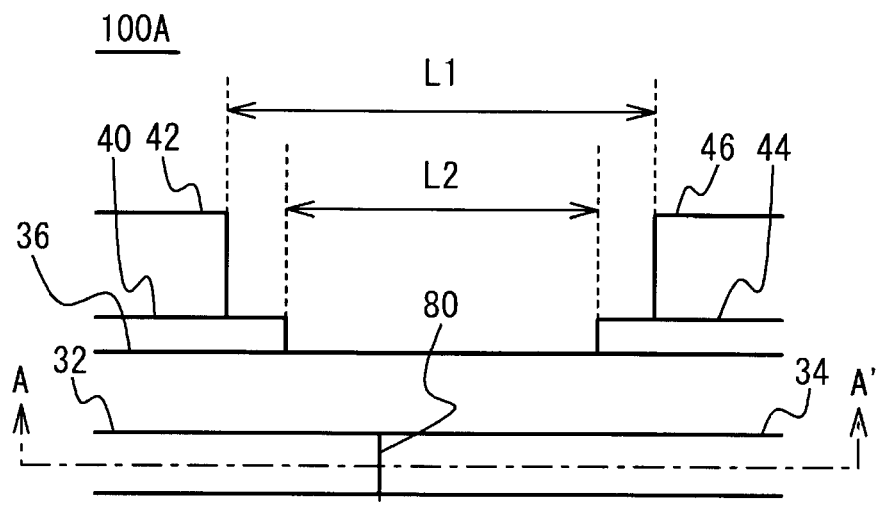
FIGS. 2A and 2B illustrate the structure of the semiconductor laser in accordance with the comparative example.

The inventors studied a change of the modulator-integrated semiconductor laser such that the width of the modulator is made narrower than the width of the gain region of the semiconductor laser. The narrowing of the modulator contributes improvement in the modulation performance. However, the gain region of the semiconductor laser is made of a material different from that of which the light absorbing region of the modulator is made. Thus, the above change may be achieved by employing a production process including selective removal of semiconductor material and regrowth. In this case, it is practically impossible to perfectly make the interface between the gain region and the light absorbing region flat. Thus, scattering of propagating light takes place on the joining plane. This scattering of propagating light may result in a high-order transverse mode. Light of the high-order transverse mode is focused on a plane different from that of light of the main mode. Thus, reliable optical coupling is not realized and great coupling loss occurs.

According to an aspect of an embodiment of the present invention, there is provided an optical semiconductor device capable of suppressing the occurrence of a high-order mode on the joining surface of two waveguides having different characteristics.

First, a description is given of a structure of a semiconductor laser that is common to a comparative example and an embodiment that will be described later.

FIG. 1A is a cross-sectional view of a semiconductor laser 100 taken along a line extending in a direction of propagation of light, and FIG. 1B is a cross-sectional view taken along a line A-A illustrated in FIG. 1A. The semiconductor laser 100 has a structure such that a gain region 10 and a modulation region 20 are monolithically formed on indium phosphide (InP) substrate 30, which is a semiconductor substrate. The gain region 10 is involved in laser oscillation, and the modulation region 20 is involved in laser modulation. An active layer 32 defined as a first waveguide and a light absorbing layer 34 defined as a second waveguide are formed on the substrate 30. The active layer 32 is a waveguide for the gain region 10, and the light absorbing layer 34 is a waveguide for the modulation region 20. The active layer 32 and the light absorbing layer 34 are connected (optically joined) on the boundary between the gain region 10 and the modulation region 20.

A common upper clad layer 36 is formed on the active layer 32 and the light absorbing layer 34. The substrate 30 functions as a lower clad layer. The above structure defines a core/clad structure in which the active layer 32 and the light absorbing layer 34 are a core. A corrugation 38 having a periodic convex portion or a periodic concave portion is formed in the substrate 30 below the active layer 32. The corrugation 38 realizes stabilized single-mode oscillation by feeding back a particular wavelength to the active layer 32 in distributed fashion. Thus, the gain region 10 functions as a semiconductor laser of distributed feedback (DFB) type.

The substrate 30, the active layer 32, the light absorbing layer 34 and the upper clad layer 36 are made of compound semiconductor including multiple elements. The compound semiconductor may be indium gallium arsenide phosphide (InGaAsP), aluminum indium gallium arsenide (AlInGaAs), or a multilayer structure thereof. The composition ratio of the elements is adjusted so that the refractive index of the core side composed of the active layer 32 and the light absorbing layer 34 is greater than that of the clad side composed of the substrate 30 and the upper clad layer 36. The active layer 32 and the light absorbing layer 34, which form a waveguide of the semiconductor laser 100, are formed so as to have characteristics (which may include the refractive index and dimension) suitable for the functions of the gain region 10 and the modulation region 20, respectively.

In the gain region 10, a contact layer 40, which may be defined as a first contact layer, is formed on the upper clad layer 36. Further, a DFB-LD (Distributed FeedBack Laser Diode) electrode 42, which may be defined as a first electrode, is formed on the contact layer 40. A DC signal for oscillating the semiconductor laser 100 is supplied to the DFB-LD electrode 42. In the modulation region 20, a contact layer 44 (second contact layer) is formed on the upper clad layer 36. Further, an EA (Electro Absorption) modulator electrode 46 (second electrode) is formed on the contact layer 44. An AC signal for modulating laser is supplied to the EA modulator electrode 46. The contact layers 40 and 44 are spaced apart from each other, and an insulating film 48 is interposed therebetween. Thus, the DFB-LD electrode 42 and the EA modulator electrode 46 are electrically isolated from each other.

Edge films 50 and 52 are formed on opposite sides of the semiconductor laser 100. An insulating film 54 is formed on a side of the DFB-LD electrode 42 closer to the edge film 50, and an insulating film 56 is formed on a side of the EA modulator electrode 46 closer to the edge film 52. As illustrated in FIG. 1B, high-resistivity layers 58 and 60 are formed so as to sandwich in the light absorbing layer 34 in the width direction thereof and to be exposed up to a position in which the upper layer of the contact layer 44 is available. The width direction of the layer 34 is perpendicular to the direction of stacking layers and the direction of propagation of light. Insulating films 62 and 64 are formed on the high-resistivity layers 58 and 60 and the upper layer of the contact layer 44 except an area in which the electrode 46 contacts the contact layer 44.

When the DC signal is applied to the DFB-LD electrode 42, laser oscillation takes place in the active layer 32 of the gain region 10. Laser light oscillated and amplified in the active layer 32 is propagated to the light absorbing layer 34 of the modulation region 20, and is modulated by the AC signal applied to the EA modulator electrode 46. The modulated laser light is emitted via the edge film 52 on the side of the semiconductor laser 100 closer to the modulation region 20.

Comparative Example

Figure 2B:
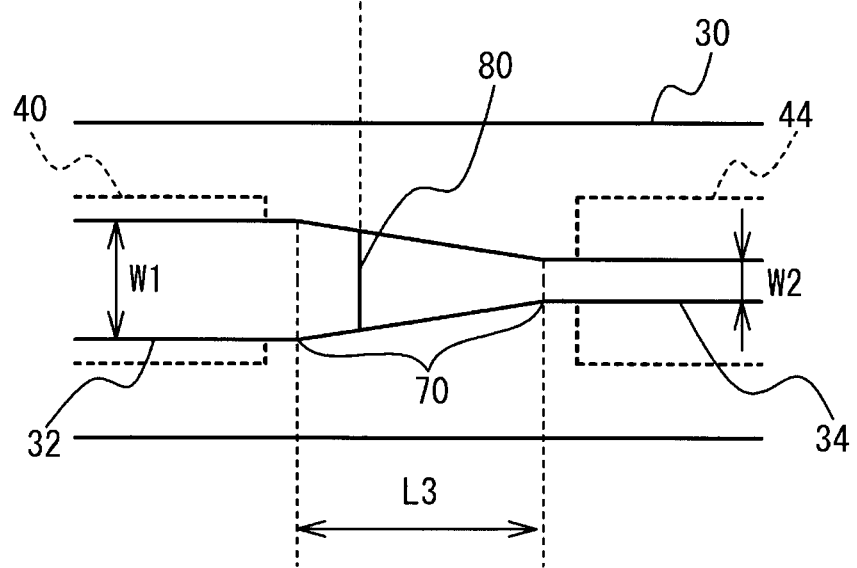

FIG. 2A is a cross-sectional view of a semiconductor laser in accordance with a comparative example, and illustrates a cross-section in the vicinity of the boundary between the gain region 10 and the modulation region 20. FIG. 2B is a top view of the semiconductor laser 100A long an A-A' line in FIG. 2A, and illustrates a waveguide viewed from the upper side (electrode side). In FIG. 2B, the contact layers 40 and 44 are drawn by dotted lines.

As has been described previously, the active layer 32 and the light absorbing layer 34 are formed so as to have the characteristics suitable for the functions of the gain region 10 and the modulation region 20, respectively. Thus, the active layer 32 and the light absorbing layer 34 have different refractive indexes and different waveguide widths, as illustrated in FIG. 2B. For example, in the gain region 10, as the waveguide is narrowed, the current density is increased and the temperature is thus raised. Thus, the reliability of laser oscillation is degraded. It is therefore preferable to increase the width W1 of the active layer 32 functioning as the waveguide so that the single-mode oscillation can be maintained.

In contrast, in the modulation region 20, it is preferable to reduce the electrostatic capacitance in order to increase the modulation rate and to reduce the width W2 of the light absorbing layer 34 functioning as the waveguide. In the comparative example, the width W1 of the active layer 32 is 1.90 μm, and the width W2 of the light absorbing layer 34 is 1.20 μm.

Since the active layer 32 and the light absorbing layer 34 have the different widths, the waveguide that connects these layers is tapered so that the waveguide is gradually narrowed towards the modulation region 20 from the gain region 10. Now, the tapered portion of the waveguide is named an intermediate waveguide portion 70. The intermediate waveguide portion 70 is configured to have a slope of the walls limited to a predetermined ratio. If the width of the intermediate waveguide portion 70 changes abruptly, the propagating light may be reflected or scattered greatly. The limited ratio of change of the width of the intermediate waveguide portion 70 suppresses reflection and scattering of the propagating light. The intermediate waveguide portion 70 gradually becomes narrower towards the modulation region 20 from the gain region 10. The walls of the intermediate waveguide portion 70 that defines the gradually narrowing width are not limited to a straight shape but may have another shape designed so that the intermediate waveguide portion 70 gradually becomes narrower towards the modulation region 20 from the gain region 10. The walls of the intermediate waveguide portion 70 may be shaped arbitrarily as long as reflection and scattering of the propagating light is suppressed sufficiently. For example, the walls of the intermediate waveguide portion 70 may be stepwise.

The active layer 32 and the light absorbing layer 34 are joined to form a joining plane 80. As illustrated in FIG. 2B, in the present comparative example, the joining plane 80 is located in the intermediate waveguide portion 70. In other words, the intermediate waveguide portion 70 is composed of both the active layer 32 and the light absorbing layer 34. More particularly, the intermediate waveguide portion 70 in the active layer 32 has a width of an end that is formed so as to become narrower towards the modulation region 20. The intermediate waveguide portion 70 in the light absorbing layer 34 has a width of an end that is formed so as to become wider towards the gain region 10. On the joining plane 80, the width of the end of the intermediate waveguide portion 70 on the active layer side and the width of the end thereof on the light absorbing layer side have an identical width. In the present comparative example, the joining plane 80 may, for example, be 1.80 μm wide.

In the production process, it is difficult to make the joining plane 80 perfectly flat. Thus, the propagating light may be reflected or scattered on the joining plane 80. This may cause a high-order transverse mode in the propagating light, which causes the loss of laser output. According to an aspect of an embodiment described below, the above problem is solved.

In FIG. 2A, it is to be noted that a distance L1 between the electrodes 42 and 46 (length L1 of a space defined therebetween), a distance L2 between the contact layers 40 and 44 (length L2 of a space defined therebetween), and a length L3 of the intermediate waveguide portion 70 may be selected arbitrarily taking the desired device specification into account. In the present comparative example, L1=100 μm, L2=70 μm and L3=60 μm. The semiconductor laser 100A is 1000 μm long.

First Embodiment

The structure of a semiconductor laser configured in accordance with a first embodiment is the same as that of the comparative example except the widths W1 and W2 and the joining plane 80.

Figure 3A:
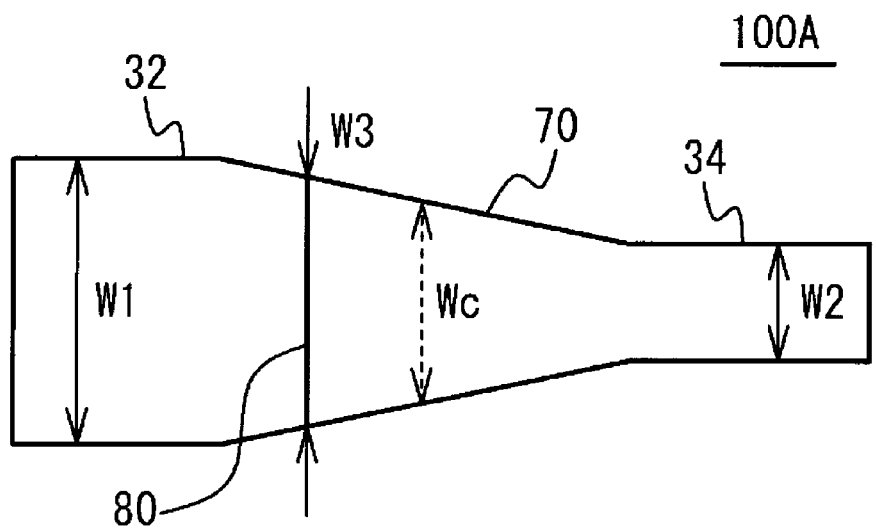
FIGS. 3A and 3B are enlarged views of structures of an optical waveguide illustrated in FIGS. 2A and 2B.
Figure 3B:
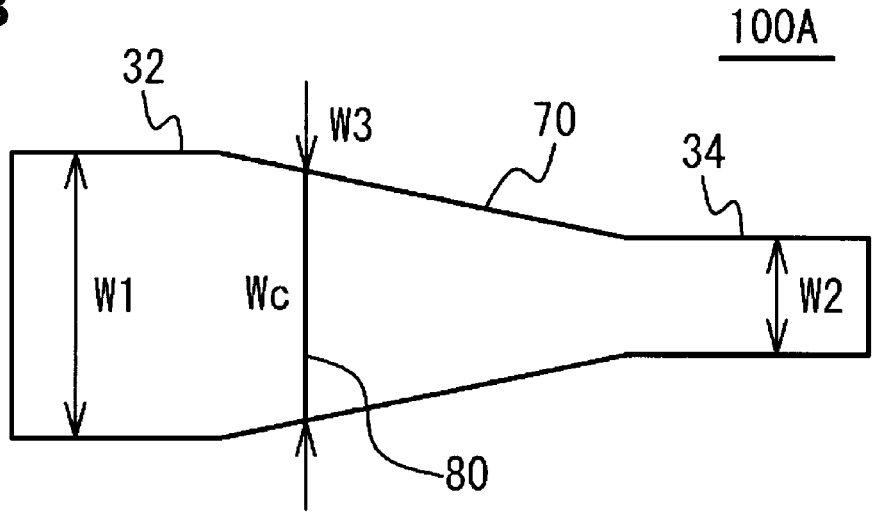

FIGS. 3A and 3B are enlarged views of the waveguide portions of the comparative example and the first embodiment, respectively. Whether the high-order mode of the propagating light occurs or not depends on the wavelength of the propagating light, the refractive index of the waveguide, and the width of the waveguide. As the waveguide becomes wider, the high-order mode is likely to occur, and the high-order mode is not allowable in a predetermined width of the waveguide or less. Now, a limit width is defined as the above predetermined width of the waveguide (which is the greatest one of the waveguide widths that allow the high-order mode).

The limit width is denoted as Wc. In the comparative example illustrated in FIG. 3A, the joining plane 80 on which the waveguide of the active layer 32 and that of the light absorbing layer 34 are joined is formed in the position in which the width of the joining plane 80 is greater than the limit width Wc. Thus, the high-order mode is allowed on the joining plane 80, and actually occurs.

In contrast, in the first embodiment illustrated in FIG. 3B, the joining plane 80 is formed in the position where the width of the waveguide is equal to the limit width Wc. Thus, the high-order mode is not allowed on the joining plane 80 and does not occur. The joining plane 80 on which the active layer 32 and the light absorbing layer 34 are joined is formed in a position where the width of the waveguide in the intermediate waveguide portion 70 is equal to or smaller than the limit width Wc. It is thus possible to suppress the occurrence of the high-order mode on the joining plane 80 and to reduce the loss of light output.

A description is now be given of a further consideration about the position of the width W3 of the joining plane 80 in the first embodiment with reference to FIGS. 3A and 3B. As illustrated in FIG. 3A, in a case where the width W3 of the joining plane 80 is positioned in a region having a width greater than the limit width Wc, the high-order mode is developed. Thus, in the first embodiment illustrated in FIG. 3B, the width W3 of the joining plane 80 is provided in a position where the width W3 is equal to or smaller than the limit width Wc, the high-order mode is not developed.

The following conditions on the limit width Wc may be defined through experiments.

Figure 4A:
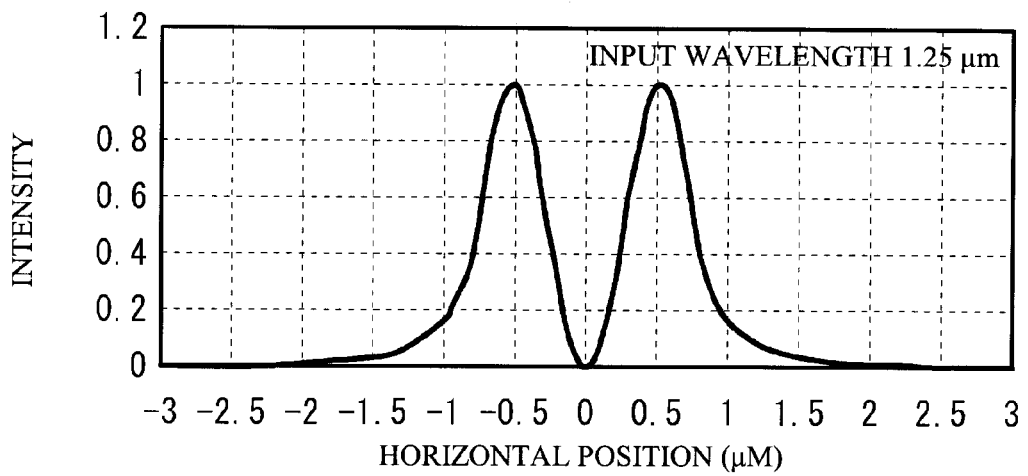
FIGS. 4A and 4B illustrate near-field patterns.
Figure 4B:
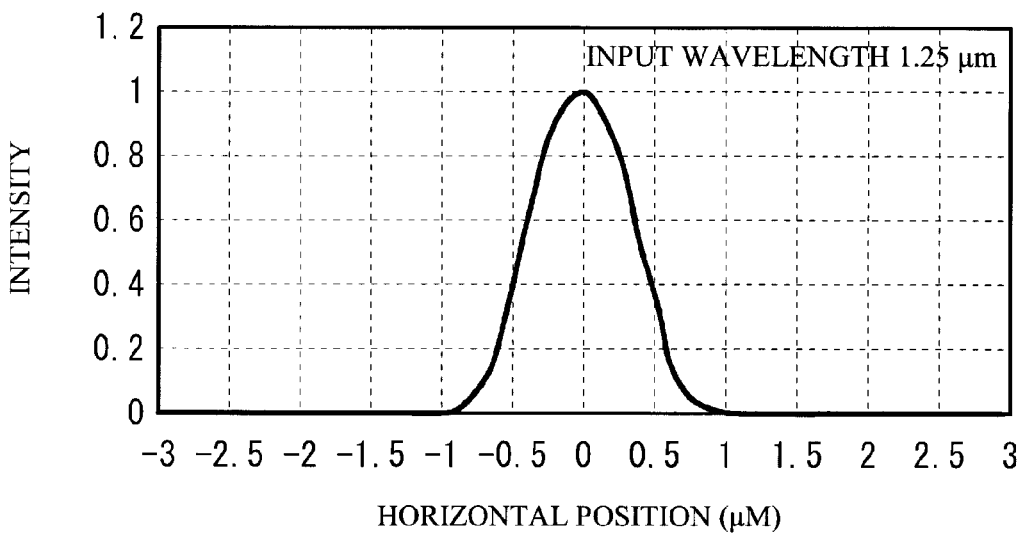

FIGS. 4A and 4B are graphs of near-field patterns associated with the width of the waveguide. As illustrated in FIG. 4A, in a case where the width W3 of the joining plane 80 is set equal to 1.50 µm, multiple near-field peaks occur because of the occurrence of the high-order mode. This experimental result shows that the width W3 of the joining plane 80 equal to 1.50 µm exceeds the limit width Wc. In this case, the occurrence of the high-order mode results in output light having a difficulty in optical coupling and increases the coupling loss. When the width W3 of the joining plane 80 is set greater than 1.50 µm, the high-order mode is more likely to take place, and the coupling loss is increased.

In contrast, FIG. 4B illustrates a case where the width W3 of the joining plane 80 is set equal to 1.35 µm. It can be seen from the graph that only one near-field peak occurs. That is, the width W3 of the joining plane 80 that is set equal to or smaller than 1.35 µm is equal to or smaller than the limit width Wc, and the occurrence of the high-order mode is thus suppressed.

In the case where the width of the gain region (first waveguide) of the semiconductor laser is equal to or greater than 1.50 µm, the high-order mode may occur in the intermediate waveguide portion in which the joining plane on which the gain region of the semiconductor laser and the light absorbing region (second waveguide) of the optical modulator is located. With the above in mind, the first embodiment is configured to meet a condition such that the joining plane in the intermediate waveguide portion has a width equal to or smaller than 1.35 µm in order to suppress the occurrence of the high-order mode.

The above condition may be applied for an embedded type waveguide in which the gain region (first waveguide) of the semiconductor laser and the light absorbing region of the optical modulator are both made of a semiconductor material that is lattice-matched with InP and the wavelength of the light propagated through the first and second waveguides is equal to or greater than 1.25 µm. A typical exemplary structure may be configured to have the first and second waveguides made of InGaAsP, AlInGaAs or a multilayer structure thereof.

Taking the above into consideration, the first embodiment employs the width W1 of 1.50 µm and the width W3 of 1.35 µm. The width W2 of the light absorbing region of the optical modulator is set equal to 1.10 µm. The other conditions are the same as those of the comparative example.

Figure 5A:
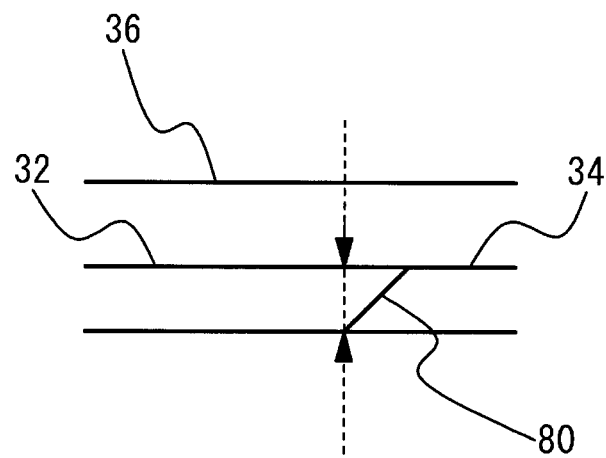
FIGS. 5A and 5B are enlarged views of portions of the optical waveguide in proximity to a joining plane.
Figure 5B:
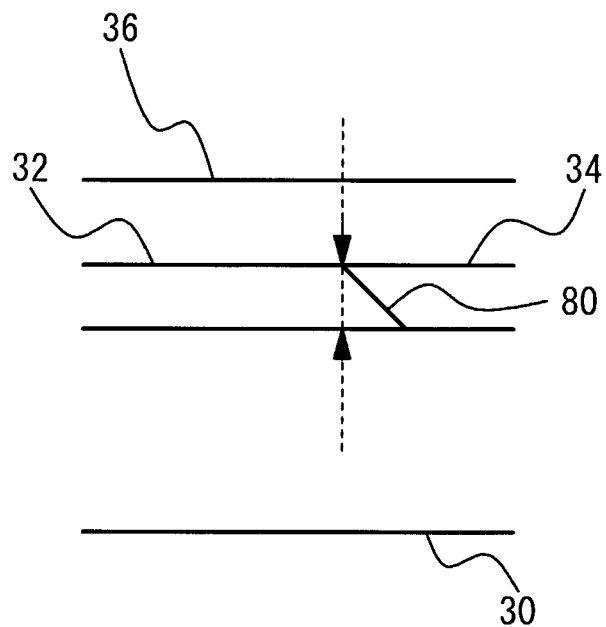

FIGS. 5A and 5B are enlarged views of portions in proximity to the joining plane 80 in FIG. 2A. The joining plane 80 is not perpendicular to the propagating direction of light but may be slightly inclined. The joining plane 80 in the inclined state may be arranged so that the width of the waveguide is equal to or smaller than the limit value Wc in the joining position of the joining plane 80 closest to the gain region 10 (active layer 32), as indicated by arrows in FIGS. 5A and 5B.

The semiconductor laser 100A of the first embodiment in FIGS. 2A and 2B may be varied so that the end of the intermediate waveguide portion 70 closer to the active layer 32 is positioned in the region in which the contact layer 40 of the gain region 10 is formed. In this variation, a part of the contact layer 40 is positioned above the intermediate waveguide portion 70. The intermediate waveguide portion 70 is arranged so as to overlap the contact layer of the gain region 10. It is thus possible to reduce the length L2 of the region that spatially separates the contact layers 40 and 44 and to downsize the semiconductor laser 100A.

The first embodiment is not limited to the aforementioned values of the width W1 of the active layer 32 and the width W2 of the light absorbing layer 34. More particularly, W1 is not limited to 1.50 µm, and W2 is not limited to 1.10 µm. The widths W1 and W2 may be selected taking the device specification into account. For example, the width W1 of the active layer 32 is preferably equal to or greater than 1.50 µm. More preferably, W1 is in the range of 1.50 µm to 2.00 µm. The width W2 of the light absorbing layer 34 is smaller than the width W3 of the joining plane 80 (that is, 1.35 µm). Preferably, W3 is in the range of 1.00 µm to 1.30 µm taking the modulation performance into consideration.

The present invention is not limited to the specifically described embodiments and variations, but may include other embodiments and variations without departing from the scope of the present invention.

What is claimed is:

1. An optical semiconductor device in which light having a wavelength of 1.25 µm or greater is waveguided, comprising:
   a first waveguide of embedded type that includes a semiconductor and is lattice-matched with InP, the first waveguide having a region having a first constant width equal to or greater than 1.50 µm and a first region narrower than the region having the first constant width equal to or greater than 1.50 µm; and
   a second waveguide of embedded type that includes another semiconductor having a refractive index different from that of the first waveguide, the second waveguide having a region having a second constant width smaller than 1.50 µm and a second region wider than said region having the second constant width smaller than 1.50 µm,
   the first waveguide and the second waveguide being joined at an intermediate waveguide portion, the intermediate waveguide portion including the first region and the second region and a joining plane on which the first region and the second region are joined, and the joining plane having a width equal to or smaller than 1.35 µm.

2. The optical semiconductor device according to claim 1, wherein the first waveguide comprises an active layer of a semiconductor laser, and the second waveguide comprises a light absorbing layer of the semiconductor laser.

3. The optical semiconductor device according to claim 2, wherein cores of the first and second waveguides comprise InGaAsP, AlInGaAs or a multilayer structure thereof.

4. The optical semiconductor device according to claim 1, further comprising contact layers respectively provided on a constant width portion of the first waveguide and a constant width portion of the second waveguide, and a space region between the contact layers is provided on the intermediate waveguide portion.

5. The optical semiconductor device according to claim 4, wherein a part of one of the contact layers is positioned above the intermediate waveguide portion.

\* \* \* \* \*